(12) United States Patent
Sato et al.

(10) Patent No.: US 9,345,074 B2
(45) Date of Patent: May 17, 2016

(54) ORGANIC EL DISPLAY APPARATUS

(71) Applicant: Japan Display Inc., Tokyo (JP)

(72) Inventors: Toshihiro Sato, Tokyo (JP); Hironori Toyoda, Tokyo (JP)

(73) Assignee: Japan Display Inc., Tokyo (JP)

( * ) Notice: Subject to any disclaimer, the term of this patent is extended or adjusted under 35 U.S.C. 154(b) by 158 days.

(21) Appl. No.: 14/168,073

(22) Filed: Jan. 30, 2014

(65) Prior Publication Data
US 2014/0217924 A1 Aug. 7, 2014

(30) Foreign Application Priority Data

Feb. 5, 2013 (JP) .................................. 2013-020222

(51) Int. Cl.
G09G 3/19 (2006.01)
G09G 3/30 (2006.01)
H05B 33/08 (2006.01)
G09G 3/20 (2006.01)
G09G 3/32 (2016.01)
H01L 27/32 (2006.01)

(52) U.S. Cl.
CPC .............. H05B 33/08 (2013.01); G09G 3/2003 (2013.01); G09G 3/3233 (2013.01); H01L 27/3232 (2013.01); G09G 2320/029 (2013.01); G09G 2320/0242 (2013.01); G09G 2320/045 (2013.01); G09G 2320/048 (2013.01); G09G 2320/0666 (2013.01)

(58) Field of Classification Search
CPC .................. G09G 2320/043; G09G 2320/045; G09G 2320/046; G09G 2320/048; G09G 3/19; G09G 3/38; G09G 3/14; G09G 3/12; G09G 3/30

USPC .............................. 345/36, 39, 45–46, 76–83; 348/800–801; 349/104–106
See application file for complete search history.

(56) References Cited

U.S. PATENT DOCUMENTS

| 7,265,890 | B1 * | 9/2007 | Demiryont et al. | ........... 359/269 |
| 2005/0048311 | A1 * | 3/2005 | Hatwar et al. | ................ 428/690 |
| 2005/0156831 | A1 * | 7/2005 | Yamazaki et al. | .............. 345/76 |
| 2011/0242449 | A1 * | 10/2011 | Chang | ............................. 349/61 |
| 2012/0162280 | A1 * | 6/2012 | Yamashita et al. | ........... 345/690 |

FOREIGN PATENT DOCUMENTS

| JP | 2005-85683 | 3/2005 |
| JP | 2011-35087 | 2/2011 |

* cited by examiner

Primary Examiner — Temesgh Ghebretinsae
Assistant Examiner — Hang Lin
(74) Attorney, Agent, or Firm — Typha IP LLC

(57) ABSTRACT

In an organic EL display apparatus, a chromaticity change of image display due to deterioration in an OLED is corrected. The organic EL display apparatus includes an EC element layer formed of one kind or a plurality of kinds of electrochromic elements which are disposed on an OLED portion and develop colors. Each of the electrochromic elements has a peak in a transmission spectrum during development of a color in any one of the emission wavelength bands of the pixels corresponding to the plurality of colors. The electrochromic element receives a DC voltage from a driver so as to be driven. Chromaticity of image display is adjusted by controlling a color development intensity of the electrochromic element by using the DC voltage which is applied by the driver.

2 Claims, 5 Drawing Sheets

ORGANIC EL DISPLAY APPARATUS

CROSS-REFERENCE TO RELATED APPLICATION

The present application claims priority from Japanese application JP2013-20222 filed on Feb. 5, 2013, the content of which is hereby incorporated by reference into this application.

BACKGROUND OF THE INVENTION

1. Field of the Invention

The present invention relates to an organic electroluminescence (EL) display apparatus, and particularly to a technique of correcting a chromaticity change of image display due to deterioration in a light emitting portion.

2. Description of the Related Art

An organic EL display apparatus performs image display by using electroluminescence corresponding to a plurality of colors such as red (R), green (G), and blue (B) emitted by organic light-emitting diodes (OLEDs), and can display white by mixing the plurality of colors in an appropriate balance. Here, the OLED deteriorates over time, and deterioration speed is generally different depending on a material or the like of an emission layer. Therefore, a difference occurs in a change in an emission intensity of each color due to the deterioration. In other words, the balance of emission intensities of the OLEDs corresponding to a plurality of colors changes due to deterioration over time, and, as a result, for example, even if an image signal for displaying white is input, chromaticity of screen display deviates from white. This chromaticity change can be corrected by adjusting a driving current of the OLED so as to change an emission intensity of each color.

SUMMARY OF THE INVENTION

In the method of correcting the chromaticity by increasing the emission intensity of the OLED whose emission efficiency is reduced due to the deterioration, through the adjustment of a driving current of the OLED, as a result of an increase in a driving current which flows through the OLED which has deteriorated, there is a problem in that deterioration in the OLED is accelerated, and thus the lifetime of a display device is shortened, or power consumption increases.

The present invention provides an organic EL display apparatus which enables chromaticity to be corrected while preventing acceleration of deterioration in an OLED or an increase in power consumption.

(1) In an organic EL display apparatus according to the present invention, which includes a light emitting portion using organic electroluminescence, and in which pixels of a plurality of colors emitting lights in mutually different emission wavelength bands by using light from the light emitting portion are disposed in a display region, the apparatus includes a electrochromic element or a plurality of kinds of electrochromic elements that develop mutually different colors, the electrochromic element being disposed in the display region; and a driver that applies a DC voltage to the electrochromic elements, in which each of the electrochromic elements has a peak of a transmission spectrum during color development in any one of the emission wavelength bands of the pixels corresponding to the plurality of colors, and in which chromaticity of image display can be adjusted by controlling a color development intensity of the electrochromic element by using the DC voltage.

(2) In the organic EL display apparatus according to the above (1), the light emitting portion may include a lower electrode and an upper electrode that have an organic emission layer interposed therebetween and apply an electrical signal to the organic emission layer, and, here, the electrochromic element may include an electrochromic layer laminated on the upper electrode, and the upper electrode may be used as an electrode which applies a voltage to the electrochromic layer.

(3) In the organic EL display apparatus according to the above (1) or (2), each of the electrochromic elements may be formed in common on the pixels corresponding to the plurality of colors, and may be driven by the common DC voltage.

(4) In the organic EL display apparatus according to the above (3), the light emitting portion may generate white light by mixing respective lights caused by the organic electroluminescence corresponding to a plurality of colors, and, here, each of the pixels may be provided with a color filter through which a component of the emission wavelength band of the pixel in the white light is transmitted.

(5) In the organic EL display apparatus according to the above (3), the light emitting portion may be provided with a light emitting layer for each pixel, the light emitting layer causing the organic electroluminescence of a color corresponding to the pixel.

(6) In the organic EL display apparatus according to the above (1) or (2), each of the electrochromic elements may be driven for each pixel or for each partitioned region obtained by partitioning the display region.

(7) In the organic EL display apparatus according to any one of the above (1) to (6), the driver may include a storage unit that stores in advance a correspondence relationship between a total driving time of the light emitting portion and the DC voltage of each electrochromic element for obtaining color development for compensating for a chromaticity change over time of the light emitting portion corresponding to the total driving time; and a driving time measurement unit that measures the total driving time. In addition, the DC voltage which is to be applied to each of the electrochromic elements may be set on the basis of the measured total driving time and the correspondence relationship.

(8) In the organic EL display apparatus according to any one of the above (1) to (6), the driver may include a storage unit that stores in advance a correspondence relationship between an extent of deterioration in the light emitting portion and the DC voltage of each electrochromic element for obtaining color development for compensating for a chromaticity change of the light emitting portion due to the deterioration; and a deterioration detection unit that detects an extent of the deterioration in the light emitting portion. In addition, the DC voltage which is to be applied to each of the electrochromic elements may be set on the basis of the detected extent of the deterioration and the correspondence relationship.

DETAILED DESCRIPTION OF THE INVENTION

An organic EL display apparatus according to an embodiment of the present invention is provided with a pixel array unit which includes a plurality of pixels including OLEDs and displays an image in a display region and a driver which drives the pixel array unit. The pixels corresponding to a plurality of colors which emit lights in different emission wavelength bands are arranged in the display region, and thus the organic EL display apparatus can display a color image. The embodiment of the present invention describes an example in which the pixels corresponding to a plurality of colors are R, G and B pixels. The R pixel emits red (R) light, the G pixel emits green (G) light, and the B pixel emits blue (B) light. The pixels are arranged two-dimensionally in a matrix in the display region. The embodiment of the present invention describes an example in which the R pixels, G pixels, and B pixels are arranged in the display region in a stripe form. In this arrangement, the pixels of the same color are arranged in a vertical direction of an image, and the RGB pixels are periodically arranged in a horizontal direction thereof.

Hereinafter, the organic EL display apparatus according to the embodiment of the present invention will be described with reference to the drawings.

First Embodiment

Figure 1:
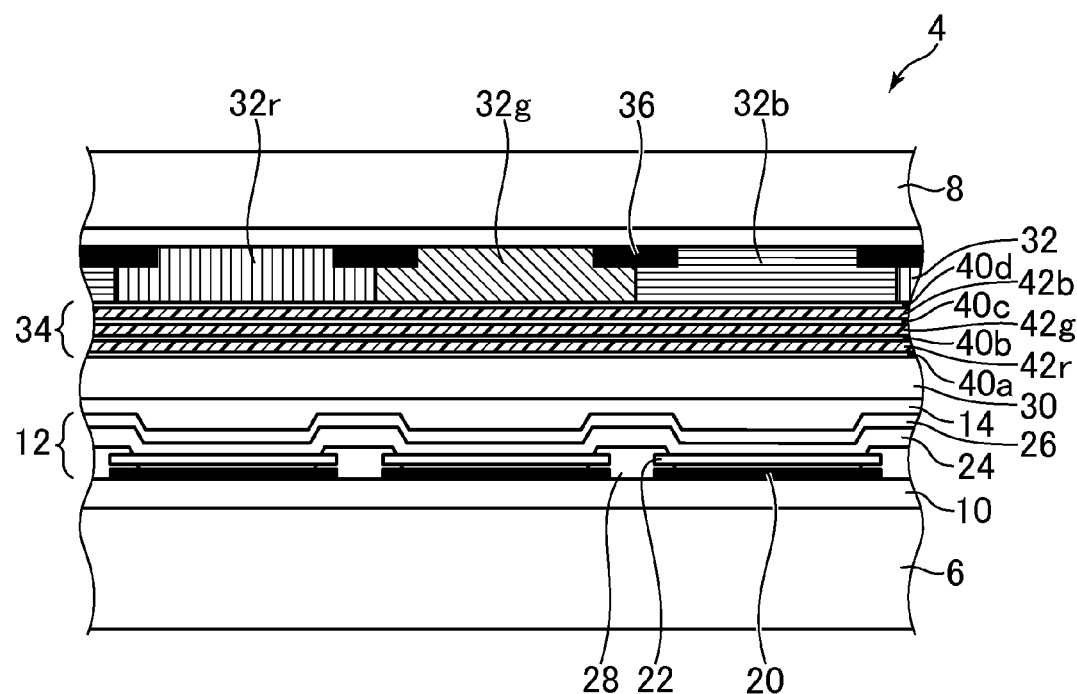
FIG. 1 is a schematic partial cross-sectional view of a pixel array unit of an organic EL display apparatus according to a first embodiment of the present invention.

FIG. 1 is a schematic partial cross-sectional view of the pixel array unit 4 of the organic EL display apparatus 2 according to the first embodiment of the present invention, and illustrates a cross-section taken along the horizontal direction of the display region. A main structure of the pixel array unit 4 is formed between a TFT substrate 6 and a sealing substrate 8. The pixel array unit 4 is of a top emission type. OLEDs which are a light emitting portion are formed on the TFT substrate 6, and light generated by the OLEDs is emitted from the sealing substrate 8. In other words, the light from the OLEDs is emitted upward in FIG. 1. In addition, the organic EL display apparatus 2 illustrated in FIG. 1 displays a color image by using color filters. The OLEDs generate white light, and the white light passes through the color filters, thereby obtaining each color of RGB.

The TFT substrate 6 is formed of, for example, a glass substrate. The TFT substrate 6 is provided with a circuit portion 10, an OLED portion 12, a sealing film 14, and the like which are laminated.

The circuit portion 10 is formed on the surface of the TFT substrate 6, and includes a thin film transistor (TFT), a scanning signal line, an image signal line, a driving power supply line, and the like for driving the OLED portion 12 which is formed on the circuit portion 10, in an active matrix manner. Specifically, a pixel circuit including a turning-on TFT and a driving TFT is formed for each pixel. For example, the turning-on TFT has an n channel. The scanning signal line is provided for each line (pixel row) of the pixels in the horizontal direction, and is connected in common to gates of a plurality of turning-on TFTs of a corresponding pixel row. In addition, the image signal line is provided for each line (pixel column) of the pixels in the vertical direction, and is connected in common to drains of a plurality of turning-on TFTs of a corresponding pixel column. Further, at least a part of the driver may be integrally formed with the pixel array unit 4 as the circuit portion 10 on the TFT substrate 6. Furthermore, a detailed structure of the circuit portion 10 is not illustrated in FIG. 1.

The OLED portion 12 is configured to include reflective layers 20, lower electrodes 22, an organic layer 24, an upper electrode 26, and a bank 28. The organic layer 24 is configured to include a hole injection layer, a hole transport layer, an emission layer, an electron transport layer, an electron injection layer, and the like. The lower electrode 22, the upper electrode 26, and the organic layer 24 interposed therebetween constitute the OLED. As described above, the OLED of the present embodiment generates white light. Specifically, the emission layer includes a laminate of emission layers corresponding to respective colors of RGB, and the white light is generated by mixing lights caused by organic electroluminescence corresponding to the respective colors of RGB.

The lower electrode 22 and the upper electrode 26 respectively form an anode electrode (anode) and a cathode electrode (cathode) of the OLED, and light emission in the emission layer is controlled by an electrical signal applied between the anode and the cathode. The upper electrode 26 is basically formed in common on the pixels of the entire display region, and a common voltage is applied thereto from the driver. On the other hand, the lower electrode 22 is formed for each pixel, and a current corresponding to an image signal is supplied thereto from the driver via the pixel circuit and the driving power supply line of each pixel. In addition, the bank 28 is formed of an insulating layer between the pixels, and electrically separates the lower electrodes 22. Further, the reflective layer 20 is disposed under the lower electrode 22, and reflects light from the emission layer toward the display surface, that is, the sealing substrate 8 side.

The sealing film 14 is laminated on the OLED portion 12. In order for characteristics of the OLED to be prevented from deteriorating due to moisture, the sealing film 14 has a moistureproof function of protecting the OLED from moisture included in a filling layer 30. For example, the sealing film 14 is made of silicon nitride (SiN), and is formed using CVD or the like.

The sealing substrate 8 is formed of a transparent material such as, for example, a glass substrate. The sealing substrate 8 is provided with color filters 32, an electrochromic (EC) element layer 34, and the like which are laminated. The sealing substrate 8 provided with the layers and the TFT substrate 6 provided with the above-described laminate structure are joined together by opposing the sealing film 14 to the EC element layer 34 with the filling layer 30 interposed therebetween. The filling layer 30 fills a gap between the laminate of the TFT substrate 6 side and the laminate of the sealing substrate 8 side so as to seal the gap. The filling layer 30 has fluidity, and is made of a material such as a curable synthetic resin. The filling layer 30, for example, is printed, or is laminated by a dispenser, on the sealing substrate 8 side, in a fluidity state. In addition, the TFT substrate 6 side is joined to the sealing substrate 8 side, and then the filling layer 30 is cured by heat or the like.

The OLED portion 12 generates white light from each pixel, and the color filters 32 selectively transmit light of a component corresponding to a color of a pixel therethrough, in the white light generated by the OLED. Specifically, as the color filters 32, a color filter 32r through which a red wavelength band is transmitted is disposed so as to correspond to the R pixel, a color filter 32g through which a green wavelength band is transmitted is disposed so as to correspond to the G pixel, and a color filter 32b through which a blue wavelength band is transmitted is disposed so as to correspond to the B pixel. Here, an emission wavelength band of each pixel is defined by a spectrum which is obtained by multiplying the emission spectrum of the OLED by a transmission characteristic of each of the color filters 32r, 32g and 32b corresponding to the pixel. In addition, black matrices 36 are disposed at the boundaries between the color filters 32r, 32g and 32b.

The EC element layer 34 is formed of one kind of EC element or a laminate of a plurality of kinds of EC elements developing different colors. Each EC element in the present invention has a peak of a transmission spectrum during color development in any one of the emission wavelength bands of the pixels corresponding to a plurality of colors. In the present embodiment, the EC element layer 34 has a laminate structure of an R development EC element of which a peak of a transmission spectrum during color development is located in the emission wavelength band of the R pixel, a G development EC element of which a peak of a transmission spectrum during color development is located in the emission wavelength band of the G pixel, and a B development EC element of which a peak of a transmission spectrum during color development is located in the emission wavelength band of the B pixel.

In addition, the color development of the EC element may use colors other than RGB, and may use, for example, cyan, magenta, and yellow.

Here, it is assumed that the R development EC element, the G development EC element, and the B development EC element are disposed in the EC element layer 34 in an order closer to the TFT substrate 6. Each color development EC element includes a color development layer which is made of an electrochromic material, and a pair of transparent electrodes which apply a voltage to the color development layer interposed therebetween. Specifically, in FIG. 1, the EC element layer 34 has first to fourth electrodes as the transparent electrode for the EC element, and includes three color development layers interposed between the first to fourth electrodes. The R development EC element includes the first electrode 40a, the second electrode 40b, and an R development layer 42r interposed between the first and second electrodes; the G development EC element includes the second electrode 40b, the third electrode 40c, and a G development layer 42g interposed between the second and third electrodes; and the B development EC element includes the third electrode 40c, the fourth electrode 40d, and a B development layer 42b interposed between the third and fourth electrodes.

A DC voltage is applied to each of the electrodes 40a to 40d from the driver. In relation to the color development layers 42r, 42g and 42b of the EC element, for example, in a state in which a voltage is not applied thereto, a current is not supplied thereto, and thus the color development layers are basically transparent; however, when a voltage is applied thereto, the color development layers cause an electrochemical redox reaction by supplied electric charge so as to change a transmission characteristic of light, thereby developing colors. Specifically, the R development EC element develops a color on the basis of a voltage between the first electrode 40a and the second electrode 40b; the G development EC element develops a color on the basis of a voltage between the second electrode 40b and the third electrode 40c; and the B development EC element develops a color on the basis of a voltage between the third electrode 40c and the fourth electrode 40d. A color development intensity reversibly changes depending on an applied voltage. In other words, a developed color can be thickened by increasing a voltage, and a developed color can be thinned and then be removed by decreasing a voltage.

The R development EC element, the G development EC element, and the B development EC element are formed in common in the entire display region. In other words, the color development intensity is uniformly controlled in each pixel by a DC voltage from the driver. Accordingly, chromaticity of an image displayed in the pixel array unit 4 can be adjusted. Specifically, a change in display chromaticity due to deterioration in the OLED can be corrected by controlling the color development of the EC element.

In addition, in the present embodiment, a plurality of kinds of EC elements each of which develops a single color are used, but the EC element layer 34 may include an EC element of a single layer. For example, the OLED emitting blue light tends to deteriorate earlier than the OLEDs emitting other colors, and thus the EC element layer 34 may include only a B development EC element in order to compensate therefor. In addition, the kinds of EC elements may be reduced using a multi-color electrochromic material which changes its colors depending on an applied electrical signal.

An electrochromic material forming the color development layer 42 is not particularly limited as long as the material has a desired color development characteristic. For example, in order to realize color change having favorable display quality, a $\pi$ conjugated conductive polymer is preferably used, and, for example, a material containing a conjugated polymer may be used which is selected from a group consisting of polyparaphenylene, polythiophene, polyphenylene vinylene, polypyrrole, polyaniline, aryl amine-substituted polyarylenevinylene, and polyfluorene polymer.

Figure 2:
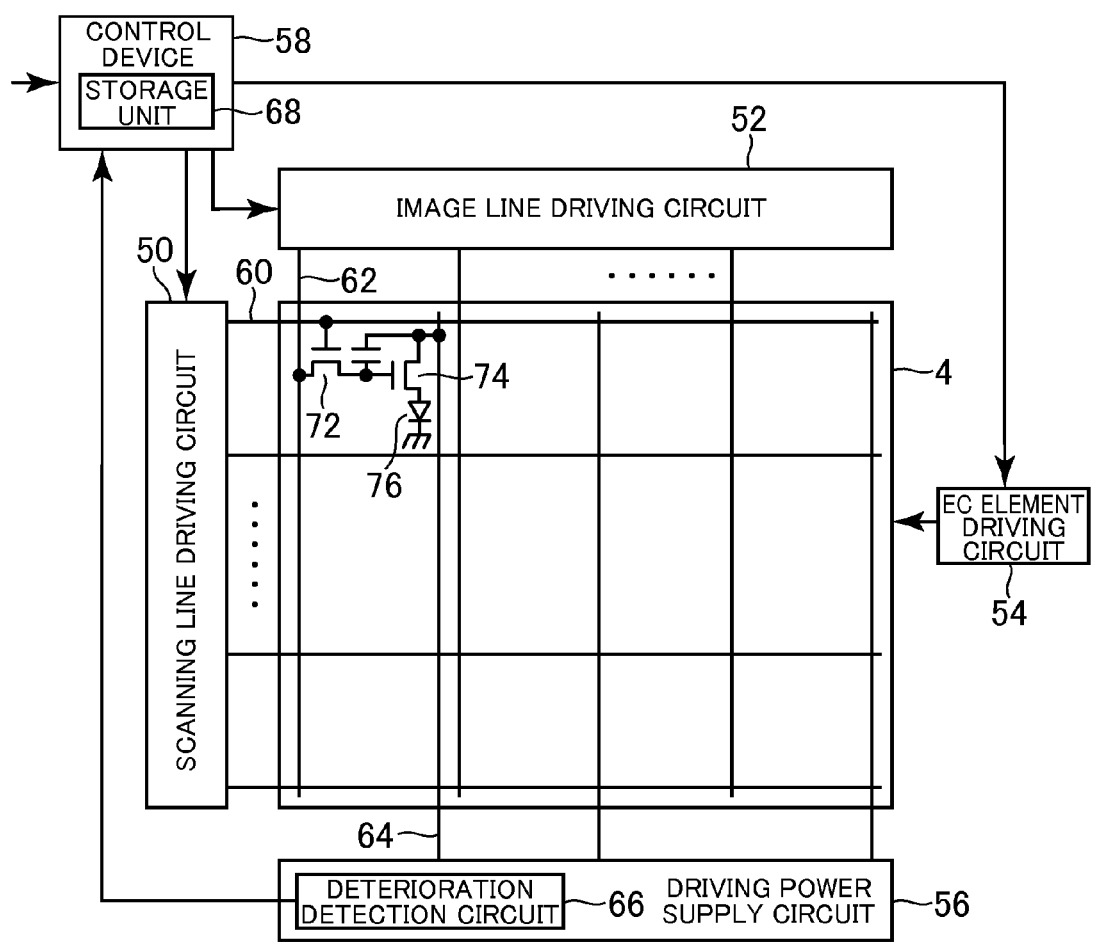
FIG. 2 is a schematic diagram illustrating a configuration of the organic EL display apparatus according to the embodiment of the present invention.

FIG. 2 is a schematic diagram illustrating a configuration of the organic EL display apparatus 2. The organic EL display apparatus 2 includes not only the pixel array unit 4, but also a scanning line driving circuit 50, an image line driving circuit 52, an EC element driving circuit 54, a driving power supply circuit 56, a control device 58, and the like as the driver.

In the pixel array unit 4, a scanning signal line 60 is formed for each pixel row, and an image signal line 62 is formed for each pixel column. A TFT is disposed at each interconnection between the scanning signal line 60 and the image signal line 62. Each TFT is controlled to be turned on and off in the row unit in response to a scanning signal applied to the scanning signal line 60, and the TFT of each pixel of a row in a turned-on state electrically connects the lower electrode 22 of the pixel to the image signal line 62.

The scanning line driving circuit 50 is connected to a plurality of scanning signal lines 60. The scanning line driving circuit 50 sequentially selects the scanning signal lines 60 on the basis of a timing signal input from the control device 58, and applies a voltage turning on the TFT to the selected scanning signal line 60. For example, the scanning line driving circuit 50 includes a shift register. The shift register starts an operation by receiving a trigger signal from the control device 58, sequentially selects the scanning signal lines 60 in an order taken along the vertical direction, and outputs a scanning pulse to the selected scanning signal line 60.

The image line driving circuit 52 is connected to a plurality of image signal lines 62. The image line driving circuit 52 receives an image signal from the control device 58, and outputs a voltage corresponding to an image signal of a selected pixel row to each image signal line 62 in synchronization with the selection of the scanning signal line 60 performed by the scanning line driving circuit 50. The voltage is written to the pixel circuit via a turning-on TFT 72 in the selected pixel row. A driving TFT 74 supplies a current corresponding to the written voltage to the OLED 76, and thus the OLED 76 of a pixel corresponding to the selected scanning signal line 60 emits light. This corresponds to horizontal scanning of a raster image. In addition, the above-described operation of the scanning line driving circuit 50 corresponds to vertical scanning.

The driving power supply circuit 56 is connected to driving power supply lines 64 which are provided for the respective pixel columns, and supplies a current to the OLED 76 via the driving power supply line 64 and the driving TFT 74 of the selected pixel row. The driving power supply circuit 56 includes a deterioration detection circuit 66 as a deterioration detection unit which detects an extent of deterioration in the OLED 76. If the OLED 76 deteriorates, a current flowing therethrough is reduced for the same image signal, and thus the OLED causes a change such as a reduction in an emission intensity. For example, the deterioration detection circuit 66 monitors a current which is supplied from the driving power supply circuit 56 to the OLED 76 via the driving power supply line 64, and outputs a value of the current to the control device 58 as information indicating deterioration.

The EC element driving circuit 54 is connected to the respective electrodes 40 of the EC elements. The EC element driving circuit 54 generates a DC voltage which is applied between the electrodes 40. The voltage generated by the EC element driving circuit 54 is controlled by the control device 58.

The control device 58 includes an arithmetic processing circuit such as a central processing unit (CPU), and a storage unit 68 constituted by a memory element such as a read only memory (ROM) or a random access memory (RAM). An image signal is input to the control device 58. For example, in a case where the organic EL display apparatus 2 forms a display unit of a computer or a portable terminal, an image signal is input to the organic EL display apparatus 2 from the computer of a main body, or the like. In addition, in a case where the organic EL display apparatus 2 forms a television receiver, an image signal is received by an antenna or a tuner (not illustrated). The control device 58 performs various processes by the CPU reading and executing a program stored in the memory. Specifically, the control device 58 performs various image signal processes such as color adjustment on an image signal, and outputs the image signal to the image line driving circuit 52. Further, the control device 58 generates a timing signal for synchronization of the scanning line driving circuit 50 or the image line driving circuit 52 on the basis of the input image signal, and outputs the timing signal to the scanning line driving circuit 50 or the image line driving circuit 52.

Furthermore, the control device 58 controls the EC elements, and corrects a chromaticity change of image display due to deterioration in the OLED 76 which is a light emitting portion. When this correction is performed, the control device 58 grasps an extent of deterioration in the OLED 76 from an output of the deterioration detection circuit 66. Moreover, the correction uses a correspondence relationship, stored in the storage unit 68 in advance, between an extent of deterioration in the light emitting portion and a driving DC voltage of the EC element for obtaining color development for compensating for a chromaticity change of the light emitting portion due to the deterioration.

Here, a relationship between an output of the deterioration detection circuit 66 and a chromaticity change of image display may be obtained in advance in a method such as measurement using an equivalent light emitting portion. In addition, a relationship between color development for compensating for the chromaticity change of the light emitting portion and a driving DC voltage of the EC element which realizes the color development may also be obtained through preliminary measurement or the like. The correspondence relationship between an output of the deterioration detection circuit 66 and a driving DC voltage of the EC element for compensating for the chromaticity change is obtained from the above-described fact, and is stored in the storage unit 68.

The control device 58 determines a driving DC voltage of the EC element on the basis of an output of the deterioration detection circuit 66 and the correspondence relationship stored in the storage unit 68, and controls the EC element driving circuit 54 so as to output the determined voltage.

Figure 3:
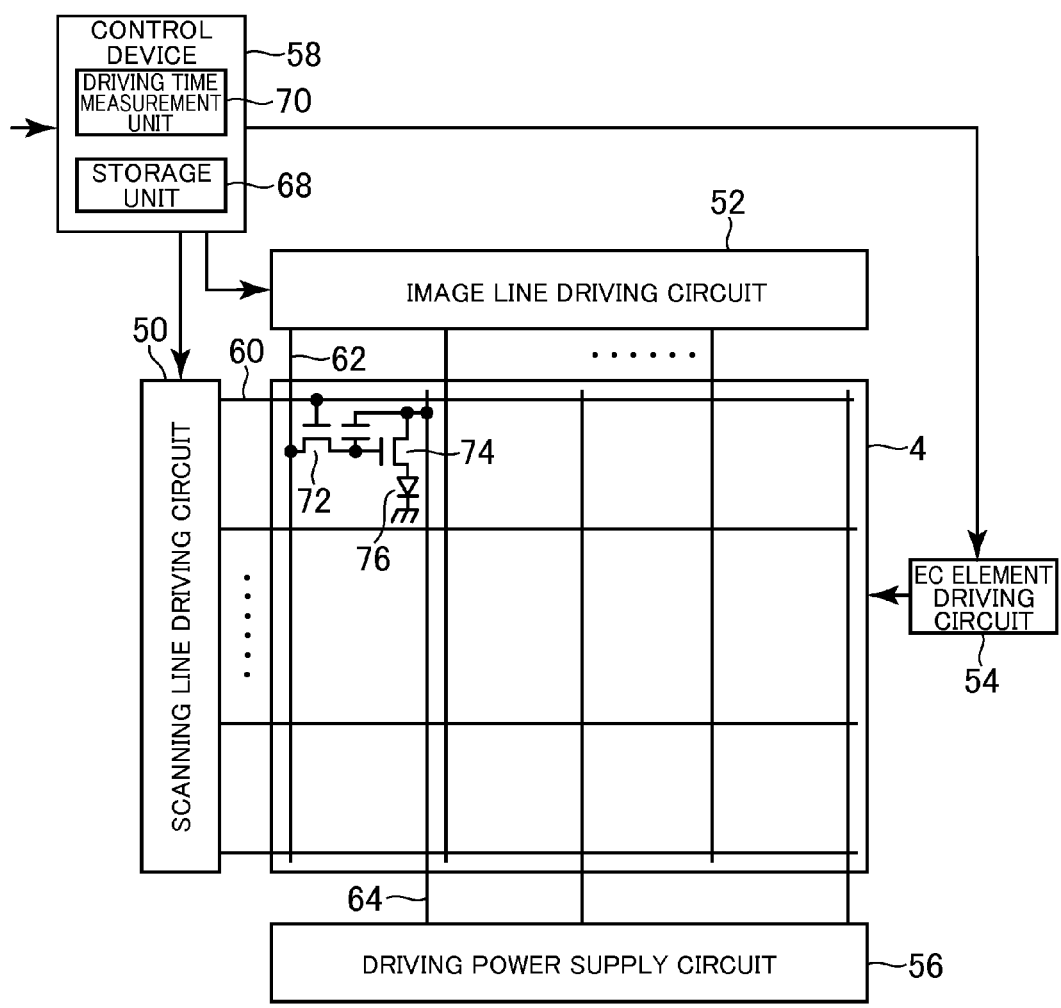
FIG. 3 is a schematic diagram illustrating another configuration of the organic EL display apparatus according to the embodiment of the present invention.

FIG. 3 is a schematic diagram illustrating another configuration of the organic EL display apparatus 2 which corrects a chromaticity change, in which the same constituent elements as in the configuration of FIG. 2 are given the same reference numerals, and a difference from the configuration of FIG. 2 will be mainly described. In this configuration, the control device 58 grasps an extent of deterioration in the OLED 76 by using a driving time measurement unit 70, instead of an output of the deterioration detection circuit 66. The driving time measurement unit 70 may be implemented using the arithmetic processing circuit of the control device 58 and a program. The driving time measurement unit 70 totals a driving time of the organic EL display apparatus 2 from a reference time such as a use start time (factory shipment) of the organic EL display apparatus 2. On the other hand, a correspondence relationship between a total driving time of the light emitting portion from the reference time and a driving DC voltage of the EC element for obtaining color development for compensating for a chromaticity change over time of the light emitting portion corresponding to the total driving time, is stored in the storage unit 68 in advance. The control device 58 determines a driving DC voltage of the EC element on the basis of an output of the driving time measurement unit 70 and the correspondence relationship stored in the storage unit 68, and controls the EC element driving circuit 54 so as to output the determined voltage. In addition, a relationship between a total driving time and a chromaticity change of image display is obtained through preliminary measurement, or the like, and the correspondence relationship stored in the storage unit 68 is defined using a result thereof.

The control device 58 determines a driving DC voltage of the EC element on the basis of an output of the driving time measurement unit 70 and the correspondence relationship stored in the storage unit 68, and controls the EC element driving circuit 54 so as to output the determined voltage.

In addition, the driving time measurement unit 70 may increase estimation accuracy of an extent of deterioration in the OLED 76 by using a driving time weighted with average luminance for each frame of an image which is obtained from an image signal by the control device 58 or a color-dependent driving time weighted with average luminance of each color of RGB for each frame, instead of a simply total driving time.

Second Embodiment

An organic EL display apparatus 2 according to the second embodiment of the present invention is different from the first embodiment in a structure of the pixel array unit 4. Hereinafter, constituent elements having the same function as in the first embodiment are given the same reference numerals, and the second embodiment will be described mainly based on a difference from the first embodiment.

Figure 4:
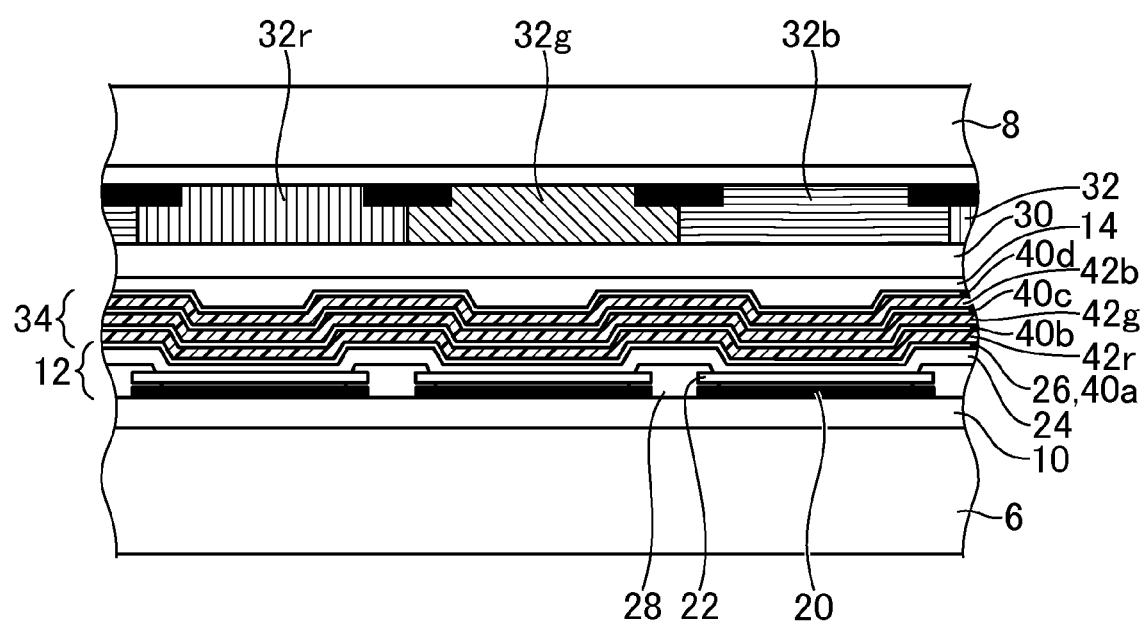
FIG. 4 is a schematic partial cross-sectional view of a pixel array unit of an organic EL display apparatus according to a second embodiment of the present invention.

FIG. 4 is a schematic partial cross-sectional view of the pixel array unit 4 of the organic EL display apparatus 2 according to the second embodiment of the present invention, and illustrates a cross-section taken along the horizontal direction of the display region.

In the present embodiment, the EC element layer 34 is laminated on the OLED portion 12, and the sealing film 14, the filling layer 30, the color filters 32, and the sealing substrate 8 are sequentially disposed on the EC element layer 34. The first electrode 40a which is the lowermost electrode of the EC element layer 34 and the upper electrode 26 of the OLED portion 12 are made common, and are formed of the same layer. The electrodes are made common, and thus a transparent electrode of the pixel array unit 4 of the present embodiment can be further reduced by one layer than in the first embodiment. Therefore, it is possible to reduce an amount in which light generated from the OLED is absorbed until the light is emitted from the sealing substrate 8.

Driving of the EC element layer 34 is performed in the same manner as in the first embodiment, and a chromaticity change due to deterioration in the OLED is corrected.

Third Embodiment

An organic EL display apparatus 2 according to the third embodiment of the present invention is different from the first and second embodiments in a structure of the pixel array unit 4. Hereinafter, constituent elements having the same function as in the first embodiment are given the same reference numeral, and the third embodiment will be described mainly based on a difference from the first embodiment.

Figure 5:
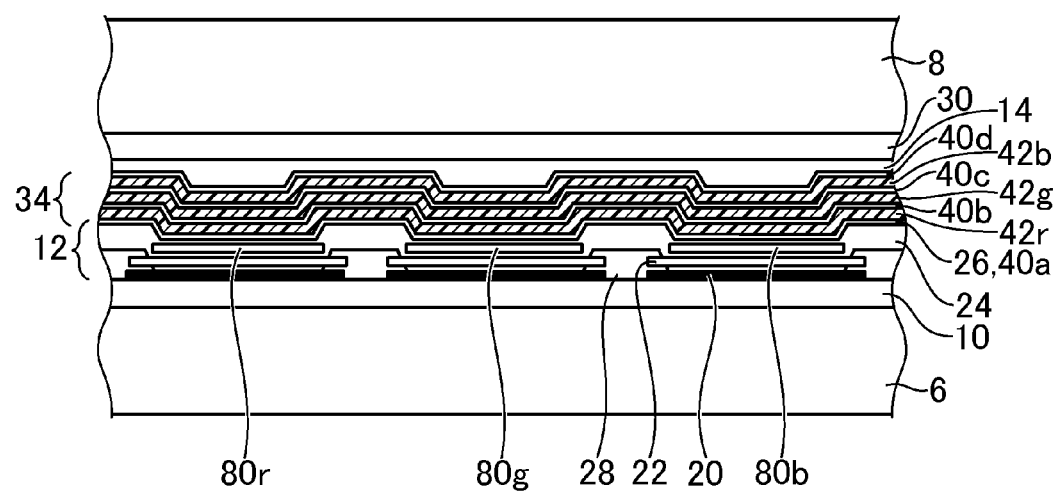
FIG. 5 is a schematic partial cross-sectional view of a pixel array unit of an organic EL display apparatus according to a third embodiment of the present invention.

FIG. 5 is a schematic partial cross-sectional view of the pixel array unit 4 of the organic EL display apparatus 2 according to the third embodiment of the present invention, and illustrates a cross-section taken along the horizontal direction of the display region.

In the organic EL display apparatus 2 according to the present embodiment, an OLED which emits light of a display color of each pixel is arranged in the OLED portion 12. In other words, in the OLED portion 12, an R light emitting layer 80r is formed in the R pixel, a G light emitting layer 80g is formed in the G pixel, and a B light emitting layer 80b is formed in the B pixel. Accordingly, color filters are not provided.

In the same manner as in the second embodiment, the EC element layer 34 is laminated on the OLED portion 12, and the first electrode 40a which is the lowermost electrode of the EC element layer 34 and the upper electrode 26 of the OLED portion 12 are made common. Therefore, it is possible to reduce absorption of light generated from the OLED.

Driving of the EC element layer 34 is performed in the same manner as in the first embodiment, and a chromaticity change due to deterioration in the OLED is corrected.

Modification Examples (1) The EC element may not be provided in the entire display region, but may be provided only at a pixel of a specific color which easily deteriorates. In this configuration, absorption of light generated from the OLED portion 12 by the EC element is performed only by the pixel of the specific color, and the EC element is not provided at a pixel with small deterioration in an emission intensity, thereby increasing luminance and reducing power consumption.

(2) The EC element may be configured to be driven for each pixel or for each partitioned region obtained by partitioning the display region. Specifically, in the EC element, one of a pair of electrodes with the color development layer 42 interposed therebetween is divided into a plurality of electrodes for the respective pixels or partitioned regions, and voltages are separately applied to the plurality of divided electrodes, for example, in an active matrix manner. In this configuration, chromaticity correction can be suitably performed on deterioration which progresses in a part of the display region. For example, burning which occurs in a display part of a fixed pattern can be corrected so as to be invisible.

According to the present invention which has been described using the embodiments and the modification examples, chromaticity correction is performed using the electrochromic element, and an emission intensity of an OLED which has deteriorated is not increased at that time. Therefore, it is possible to prevent acceleration of deterioration in the OLED or an increase in power consumption.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display apparatus which includes a light emitting portion using organic electroluminescence, and in which pixels of a plurality of colors emitting lights in mutually different emission wavelength bands by using light from the light emitting portion are disposed in a display region, the apparatus comprising:

an electrochromic element or a plurality of kinds of electrochromic elements that develop mutually different colors, the electrochromic element being disposed in the display region; and a driver that applies a DC voltage to the electrochromic elements, wherein each of the electrochromic elements has a peak of a transmission spectrum during color development in any one of the emission wavelength bands of the pixels corresponding to the plurality of colors, wherein chromaticity of image display can be adjusted by controlling a color development intensity of the electrochromic element by using the DC voltage, wherein the driver includes:

a storage unit that stores in advance a correspondence relationship between a total driving time of the light emitting portion and the DC voltage of each electrochromic element for obtaining color development for compensating for a chromaticity change over time of the light emitting portion corresponding to the total driving time; and a driving time measurement unit that measures the total driving time, and wherein the DC voltage which is to be applied to each of the electrochromic elements is set on the basis of the measured total driving time and the correspondence relationship.

2. An organic EL display apparatus which includes a light emitting portion using organic electroluminescence, and in which pixels of a plurality of colors emitting lights in mutually different emission wavelength bands by using light from the light emitting portion are disposed in a display region, the apparatus comprising:

an electrochromic element or a plurality of kinds of electrochromic elements that develop mutually different colors, the electrochromic element being disposed in the display region; and a driver that applies a DC voltage to the electrochromic elements, wherein each of the electrochromic elements has a peak of a transmission spectrum during color development in any one of the emission wavelength bands of the pixels corresponding to the plurality of colors, wherein chromaticity of image display can be adjusted by controlling a color development intensity of the electrochromic element by using the DC voltage, wherein the driver includes:

a storage unit that stores in advance a correspondence relationship between an extent of deterioration in the light emitting portion and the DC voltage of each electrochromic element for obtaining color development for compensating for a chromaticity change of the light emitting portion due to the deterioration; and
a deterioration detection unit that detects an extent of the deterioration in the light emitting portion, and
wherein the DC voltage which is to be applied to each of the electrochromic elements is set on the basis of the detected extent of the deterioration and the correspondence relationship.

* * * * *